United States Patent
Weber

(10) Patent No.: US 6,553,543 B1
(45) Date of Patent: Apr. 22, 2003

(54) AUTOMATED LOAD DETERMINATION FOR PARTITIONED SIMULATION

(75) Inventor: Larren Gene Weber, Caldwell, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/361,870

(22) Filed: Jul. 27, 1999

Related U.S. Application Data

(62) Division of application No. 08/874,602, filed on Jun. 13, 1997, now Pat. No. 6,009,249.

(51) Int. Cl.$^7$ .................................. G06F 17/50
(52) U.S. Cl. ............................................ 716/3
(58) Field of Search .................... 716/1, 2, 3

(56) References Cited

U.S. PATENT DOCUMENTS

| | | | |
|---|---|---|---|
| 4,831,543 A | 5/1989 | Mastellone | 364/489 |
| 4,878,179 A | 10/1989 | Larsen et al. | 364/490 |
| 5,043,914 A | 8/1991 | Nishiyama et al. | 364/513 |
| 5,222,030 A | 6/1993 | Dangelo et al. | 364/489 |
| 5,249,133 A | 9/1993 | Batra | 364/489 |
| 5,278,769 A | 1/1994 | Bair et al. | 364/489 |
| 5,301,318 A | 4/1994 | Mittal | 395/600 |
| 5,461,574 A * | 10/1995 | Matsunaga et al. | 364/489 |
| 5,463,563 A | 10/1995 | Bair et al. | 364/490 |
| 5,471,398 A | 11/1995 | Stephens | 364/490 |
| 5,473,546 A | 12/1995 | Filseth | 364/489 |
| 5,481,473 A | 1/1996 | Kim et al. | 364/490 |
| 5,526,277 A | 6/1996 | Dangelo et al. | 364/490 |
| 5,548,524 A | 8/1996 | Hernandez et al. | 364/489 |
| 5,550,714 A | 8/1996 | Nishiyama | 364/490 |
| 5,553,008 A | 9/1996 | Huang et al. | 364/578 |
| 5,568,396 A * | 10/1996 | Bamji et al. | 364/491 |
| 5,586,319 A | 12/1996 | Bell | 395/701 |
| 5,606,518 A | 2/1997 | Fang et al. | 364/578 |
| 5,956,257 A * | 9/1999 | Ginetti et al. | 364/490 |

OTHER PUBLICATIONS

"DC and Transient Output Variables.", *HSPICE User's Manual, vol 3, Meta–Software, Inc.*, HSPICE Version H92,, pp. 4–16—4–18, (1992).

"Probing Subcircuit Currents.", *ADM User's Guide*, Version 1.5, ADS Software, Inc., pp, 4–5—4–7, (Feb. 1995).

Engel, T.G., "Splice: A New Analytical Network Analysis Software", *IEEE*, pp. 2c6.17–2c6.19, (1995).

Frezza, S.T., et al., "SPAR: A Schematic Place and Route System", *IEEE Transactions on Computer–Aided Design of Integrated Circuits and Systems*, 12(7), 956–973, (Jul. 1993).

Harrington, B.K., "SPIL—A Program to Automatically Create ASIC Macro Models for Logic Simulation", *IEEE*, pp.p5–5.1—P5.5.4, (1990).

Kim, H.K., et al., "Concurrency Preserving Partitioning (CPP) for Parallel Logic Simulation", *IEEE*, 98–105, (1996).

(List continued on next page.)

*Primary Examiner*—Matthew Smith
*Assistant Examiner*—Leigh Marie Garbowski
(74) *Attorney, Agent, or Firm*—Schwegman, Lundberg, Woessner & Kluth, P.A.

(57) ABSTRACT

A method and device for automatically generating load circuits for a netlist. A computer system having a schematic for a circuit is used to create a netlist. While constructing the netlist, instances are checked for directives. The directives indicate that the instance should be tracked as a load circuit. For the instances having such a directive, their nets are flagged and the hierarchal portion of the circuit attached to the flagged nets is flattened. The resulting flat circuit replaces the instance in the netlist as a load circuit.

6 Claims, 14 Drawing Sheets

OTHER PUBLICATIONS

Mitra, J., et al., "Incorporating the DC Load Flow Model in the Decomposition–Simulation Method of Multi–Area Reliability Evaluation", *IEEE*, 1245–1253, (1996).

Navabi, Z., et al., "Modeling Strategy for Post Layout Verification", 7.1–7.4, (1990).

Pavan, P., et al., "A Complete Radiation Reliability Software Simulator", *IEEE Transactions on Nuclear Science*, vol. 41, No. 6, pp. 2619–2630, (Dec. 1994).

Sekine, M., et al., "An Advanced Design System: Design Capture, Functional Test Generation, Mixed Level Simulation and Logic Synthesis", *IEEE Proceedings of IEEE Custom Integrated Circuits Conference*, 19.4.1–19.4.6, (1989).

* cited by examiner

```
1   *Netlist of full circuit
2
3   *Library: slib        Cell: 2nand         View: schematic
4   *Last Time Changed: Jan 12 07:54:01 1996
5   .subckt m2nand a b y bnp vcc bnn gnd
6   mna y a net456 bnn N l='lnA' w='wnA'
7   mnb net456 b gnd bnn N l='lnB' w= 'wnB'
8   mpa y a vcc bnp P l='lpA' w='wpA'
9   mpb y b vcc bnp P l='lpB' w='wpB'
10  .ends m2nand
11
12  *Library: slib        Cell: inv           View: schematic
13  *Last Time Changed: Jan 12 07:53:31 1996
14  .subckt inv a y bnn gnd bnp vcc
15  mna y a gnd bnn N l='lnA' w='wnA'
16  npa y a vcc bnp P l='lpA' w='wpA'
17  .ends inv
18
19  *Library: Opus        Cell: TMid          View: schematic
20  *Last Time Changed: Jun 26 13:45:44 1996
21  .subckt tmid in set_ out out_ gnd vbb vcc vpp
22  xgi0 in net6 vbb gnd vpp vcc inv lnA=1.0 wnA=10.0
23  + lpA=1.0 wpA=20.0
24  xgi1 net6 out vbb gnd vpp vcc inv lnA=1.0 wnA=10.0
25  + lpA=1.0 wpA=20.0
26  c1 vcc net6 c=1e-12
27  xgna0 net13 set_ out_ vpp vcc vbb gnd m2nand lpB=1.0
28  + wpB=20.10 lpA=1.0 wpA=20.0
29  + lnB=1.0 wnB=20.0 lnA=1.0 wnA=20.0
30  c2 net6 gnd c=2e-12
31  c4 out_ gnd c=2e-12
32  c3 vcc out_ c=1e-12
33  r1 net13 in R=1e3
34  .ends tmid
35
36  *Library: Opus        Cell: TTop          View: schematic
37  *Last Time Changed: Jun 26 13:53:40 1996
38  xgi0 in1 net12 vbb gnd vpp vcc inv lnA=1.0 wnA=10.0
39  + lpA=1.0 wpA=20.0
40  xi1 net12 s1 out1 out1_ gnd vbb vcc vpp tmid
41  xi2 net12 s2 out2 out2_ gnd vbb vcc vpp tmid
```

FIG. 3

```
1   *Netlist using Cadence's nlAction to ignore subcircuits
2
3   *Library: slib        Cell: 2nand          View: schematic
4   *Last Time Changed: Jan 12 07:54:01 1996
5   .subckt m2nand a b y bnp vcc bnn gnd
6   mna y a net456 bnn N l='lnA' w='wnA'
7   mnb net456 b gnd bnn N l='lnB' w= 'wnB'
8   mpa y a vcc bnp P l='lpA' w='wpA'
9   mpb y b vcc bnp P l='lpB' w='wpB'
10  .ends m2nand
11
12  *Library: slib        Cell: inv            View: schematic
13  *Last Time Changed: Jan 12 07:53:31 1996
14  .subckt inv a y bnn gnd bnp vcc
15  mna y a gnd bnn N l='lnA' w='wnA'
16  npa y a vcc bnp P l='lpA' w='wpA'
17  .ends inv
18
19  *Library: Opus        Cell: TMid           View: schematic
20  *Last Time Changed: Jun 26 13:45:44 1996
21  .subckt tmid in set_ out out_ gnd vbb vcc vpp
22  xgi0 in net6 vbb gnd vpp vcc inv lnA=1.0 wnA=10.0
23  + lpA=1.0 wpA=20.0
24  xgi1 net6 out vbb gnd vpp vcc inv lnA=1.0 wnA=10.0
25  + lpA=1.0 wpA=20.0
26  c1 vcc net6 c=1e-12
27  xgna0 net13 set_ out_ vpp vcc vbb gnd m2nand lpB=1.0
28  + wpB=20.10 lpA=1.0 wpA=20.0
29  + lnB=1.0 wnB=20.0 lnA=1.0 wnA=20.0
30  c2 net6 gnd c=2e-12
31  c4 out_ gnd c=2e-12
32  c3 vcc out_ c=1e-12
33  r1 net13 in R=1e3
34  .ends tmid
35
36  *Library: Opus        Cell: TTop           View: schematic
37  *Last Time Changed: Jun 26 13:53:40 1996    ,
38  xgi0 in1 net12 vbb gnd vpp vcc inv lnA=1.0 wnA=10.0
39  + lpA=1.0 wpA=20.0
40  xi1 net12 s1 out1 out1_ gnd vbb vcc vpp tmid
```

FIG. 4

```
1   *Netlist resulting from the circuit loader's hspLoad property
2
3   *Library: slib           Cell: 2nand        View: schematic
4   *Last Time Changed: Jan 12 07:54:01 1996
5   .subckt m2nand a b y bnp vcc bnn gnd
6   mna y a net456 bnn N l='lnA'  w='wnA'
7   mnb net456 b gnd bnn N l='lnB'  w= 'wnB'
8   mpa y a vcc bnp P l='lpA'  w='wpA'
9   mpb y b vcc bnp P l='lpB'  w='wpB'
10  .ends m2nand
11
12  *Library: slib           Cell: inv          View: schematic
13  *Last Time Changed: Jan 12 07:53:31 1996
14  .subckt inv a y bnn gnd bnp vcc
15  mna y a gnd bnn N l='lnA'  w='wnA'
16  npa y a vcc bnp P l='lpA'  w='wpA'
17  .ends inv
18
19  *Library: Opus           Cell: TMid         View: schematic
20  *Last Time Changed: Jun 26 13:45:44 1996
21  .subckt tmid in set_ out out_ gnd vbb vcc vpp
22  xgio0 in net6 vbb gnd vpp vcc inv lnA=1.0 wnA=10.0 lpA=1.0 wpA=20.0
23  xgi1 net6 out vbb gnd vpp vcc inv lnA=1.0 wnA=10.0 lpA=1.0 wpA=20.0
24  c1 vcc net6 c=1e-12
25  xgna0 net13 set_ out_ vpp vcc vbb gnd m2nand lpB=1.0 wpB=20.10
26  + lpA=1.0 wpA=20.0
27  + lnB=1.0 wnB=20.0 lnA=1.0 wnA=20.0
28  c2 net6 gnd c=2e-12
29  c4 out_ gnd c=2e-12
30  c3 vcc out_ c=1e-12
31  r1 net13 in R=1e3
32  .ends tmid
33
34  *Library: Opus           Cell: TTop         View: schematic
35  *Last Time Changed: Jun 26 13:53:40 1996
36  xgi0 in1 net12 vbb gnd vpp vcc inv lnA=1.0 wnA=10.0 lpA=1.0
37  + wpA=20.0
38  xi1 net12 s1 out1 out1_ gnd vbb vcc vpp tmid
39  *New Loaded Pins = set_ in
40  xi2 net12 s2 out2 out2_ gnd vbb vcc vpp tmid_ldl
41
42  ***************************************************
43  *Output load circuits:
44  .subckt tmid_ldl in set_ out out_ gnd vbb vcc vpp
45  r1 net13 in R=1e3 m=1.0
46  mnaxgio0 gnd in gnd gnd N l=1.0 w=10.0 m=1.0
47  mpaxgio0 vcc in vcc vcc P l=1.0 w=20.0 m=1.0
48  mnbxgna0 gnd set_ gnd gnd N l=1.0 w=20.0 m=1.0
49  mpbxgna0 vcc set_ vcc vcc P l=1.0 w=20.0 m=1.0
50  mpaxgna0 vcc net13 vcc vcc P l=1.0 w=20.0 m=1.0
51  mnaxgna0 gnd net13 gnd gnd N l=1.0 w=20.0 m=1.0
52  .ends tmid_ldl
```

FIG. 5

AUTOMATED LOAD DETERMINATION FOR PARTITIONED SIMULATION

This application is a Divisional of U.S. Ser. No. 08/874,602 filed Jun. 13, 1997 now U.S. Pat. No. 6,009,249, dated Dec. 28, 1999.

FIELD OF THE INVENTION

The present invention relates to the design of integrated circuits and in particular to the creation of netlists from schematics for the simulation of such schematics.

BACKGROUND

Computer-aided engineering and manufacturing (CAE/CAM) technology consists of software tools that assist in the production of integrated circuits (ICs). Production of an IC begins by representing the circuit design as a schematic. Schematics consist of symbol instances connected by nets which demonstrate the functional design of the circuit. Symbol instances are pictorial icons that represent a complete functional block. Symbol instances can be primitive elements (such as transistors and resistors), abstractions of combinations of primitive elements (such as NAND gates and NOR gates), or higher level groupings of these various elements.

Netlists are a secondary representation of a circuit design. A netlist is a text file describing the circuit. The netlist lists all of the symbol instances and their connecting nets within a schematic. CAE software can be used to translate a schematic into a netlist.

A netlist is used as input to a simulator, another CAE tool. Simulators use netlists and other input files to imitate the function of the circuit design before the design is incorporated in hardware. Simulating a circuit is an efficient and cost effective method of testing a circuit. However, simulating a portion of the circuit design is problematic. One primary problem is that the circuits often contain several million individual instances connected by several million nets. The complexity of such a large structure, even when processed by a powerful computing system, cannot be simulated in its entirety by the simulator. Instead, a portion of the circuit design must be isolated for simulation. Some present systems allow only a portion to be simulated. For example, simulation software from Cadence Design Systems, Inc. of San Jose, Calif., utilizes the n1Action command. The n1Action command is used to "ignore" a portion of the circuit while simulating other portions of the circuit.

A secondary problem arises in connection with simulating just a portion of the circuit. A partial simulation is not accurate since the load on the simulated portion may depend on circuitry which is not currently being simulated. When using simulation software from Cadence Design Systems, Inc., a testing engineer must estimate the load caused by ignored portions of the circuit and then the engineer must either add this estimated amount, by hand, to the results of the simulation, or may enter this estimate into the computer system and have the system itself add this estimated amount to the results.

What is needed is a way to simulate a portion of a circuit design, while tracking the load effects from the non-simulated portions of the design. This invention would need to offer a higher degree of accuracy than is currently achieved by the testing engineer's estimation techniques in current systems. The invention would also need to be flexible so that changes to the schematic would cause the appropriate change to the load.

SUMMARY OF THE INVENTION

A method and device for automatically generating load circuits for a netlist. A computer system having a schematic for a circuit is used to create a netlist. While constructing the netlist, instances are checked for directives. The directives indicate that the instance should be tracked as a load circuit. For the instances having such a directive, the hierarchal portion of the circuit attached to the instances' nets is flattened. The collected flat circuit replaces the instance in the netlist as a load circuit.

BRIEF DESCRIPTION OF THE DRAWINGS

FIG. 3 is a netlisting of the full circuit, as shown in FIGS. 1 and 2.

FIG. 4 is a netlisting of the circuit, utilizing Cadence Design's n1Action command.

FIG. 5 is a netlist of the circuit, utilizing the present invention's automated circuit loader.

DETAILED DESCRIPTION

In the following Detailed Description, reference is made to the accompanying drawings which form a part hereof and in which is shown by way of illustration specific embodiments in which the invention may be practiced. These embodiments are described in sufficient detail to enable those skilled in the art to practice and to use the invention, and it is to be understood that other embodiments may be utilized and that changes may be made without departing from the spirit and scope of the present invention. The following Detailed Description is, therefore, not to be taken in a limiting sense and the scope of the invention is defined by the appended claims. In the figures, elements having the same number perform essentially the same functions.

The process of circuit design begins, in general, with the creation of the schematic using a CAD/CAE computer system which allows the designer to save schematic representations as files to disk (or other secondary storage). For example, a schematic 105 (from FIG. 1) can be created by a computer-aided engineering (CAE) software tool such as Design Entry, which is available from Cadence Design Systems, Inc., San Jose, Calif. While creating the instances in the schematic, the engineer adds the directives which are used by the present invention to track the load of non-simulated portions of the schematic. After the schematic is drawn, another software package, the hierarchical netlister, is executed to create the netlist. This netlist describes each type of instance occurring in the schematic.

The present invention, which is integrated with the hierarchical netlister, gathers the instances flagged with the above-mentioned directives and automatically creates load circuits in the netlist. Load circuits are used to track the load imposed by the portions of the schematic which are not being simulated. The addition of load circuits to the netlist relieves the test engineer from needing to estimate the size of load caused by the non-simulated portions of the schematic. The netlist is saved to secondary storage and is later used by verification and simulation programs (such as HSPICE, available from Meta-Soft, Inc., Campbell, Calif.) to test the schematic before it is implemented in hardware.

Figure 1:
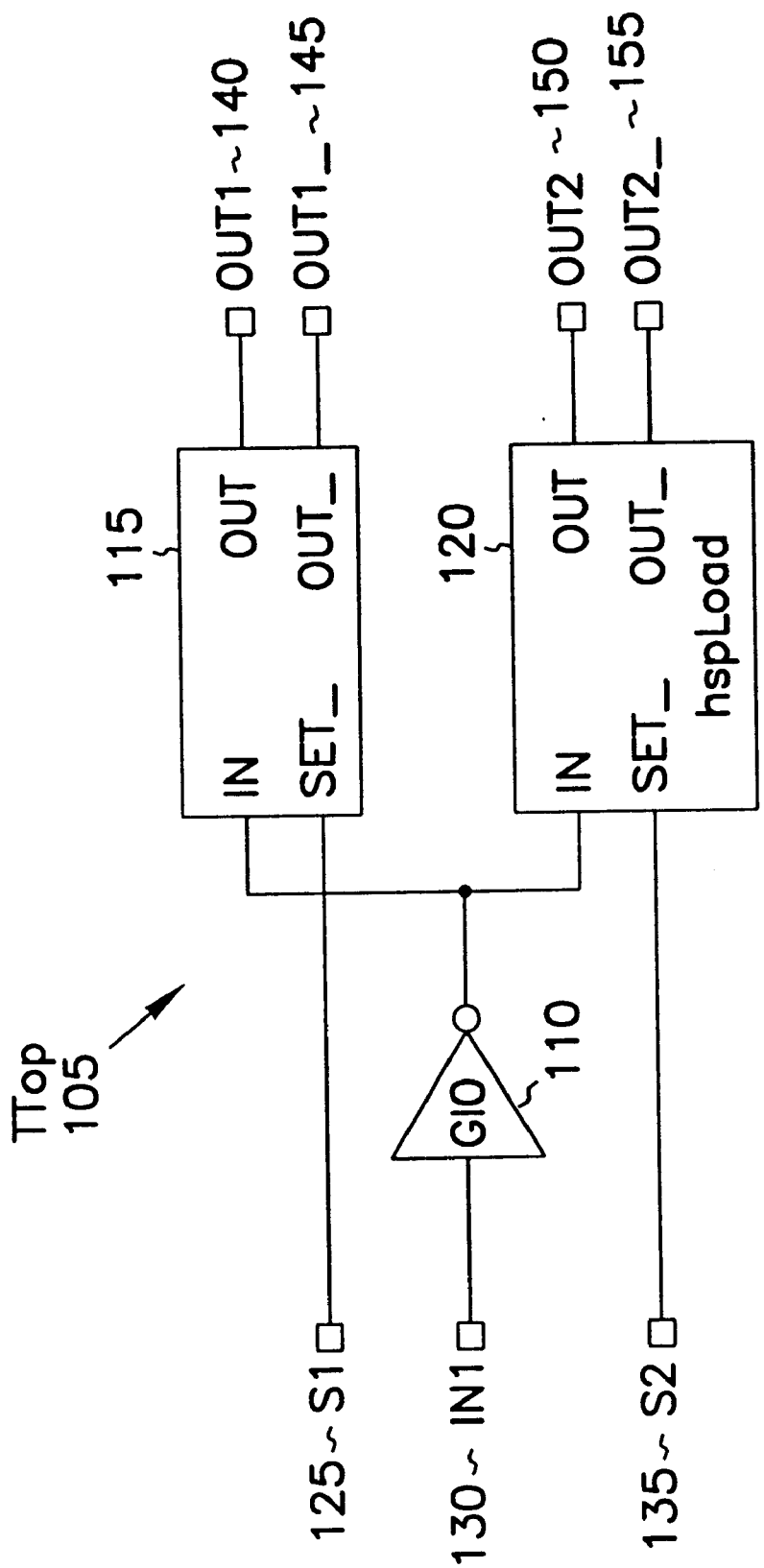
FIG. 1 is a schematic drawing of a circuit called TTop which is comprised of two instances of the subcircuit TMid.

In FIG. 1, two instances of block TMid 115 and 120 are diagramed in schematic 105 along with an invertor GI0 110. Input nets to the circuit are S1 125, IN1 130, and S2 135. The four output nets are OUT1 140, OUT1_145, OUT2 150, and OUT2_155. At this top hierarchical level of schematic 105, the contents of instance TMid 115 and instance TMid 120 are hidden from view.

With the present invention, the loading of a portion of the circuit while simulating another portion is accomplished by the use of a directive. One such directive is a "property list." Property lists are data structures supported by Design Entry and other CAD/CAE software systems. In the present invention, the property list hspLoad is used to determine whether to load a portion of a circuit during simulation. Notice that in FIG. 1, the hspLoad property list has been added to instance TMid 120.

Figure 2:
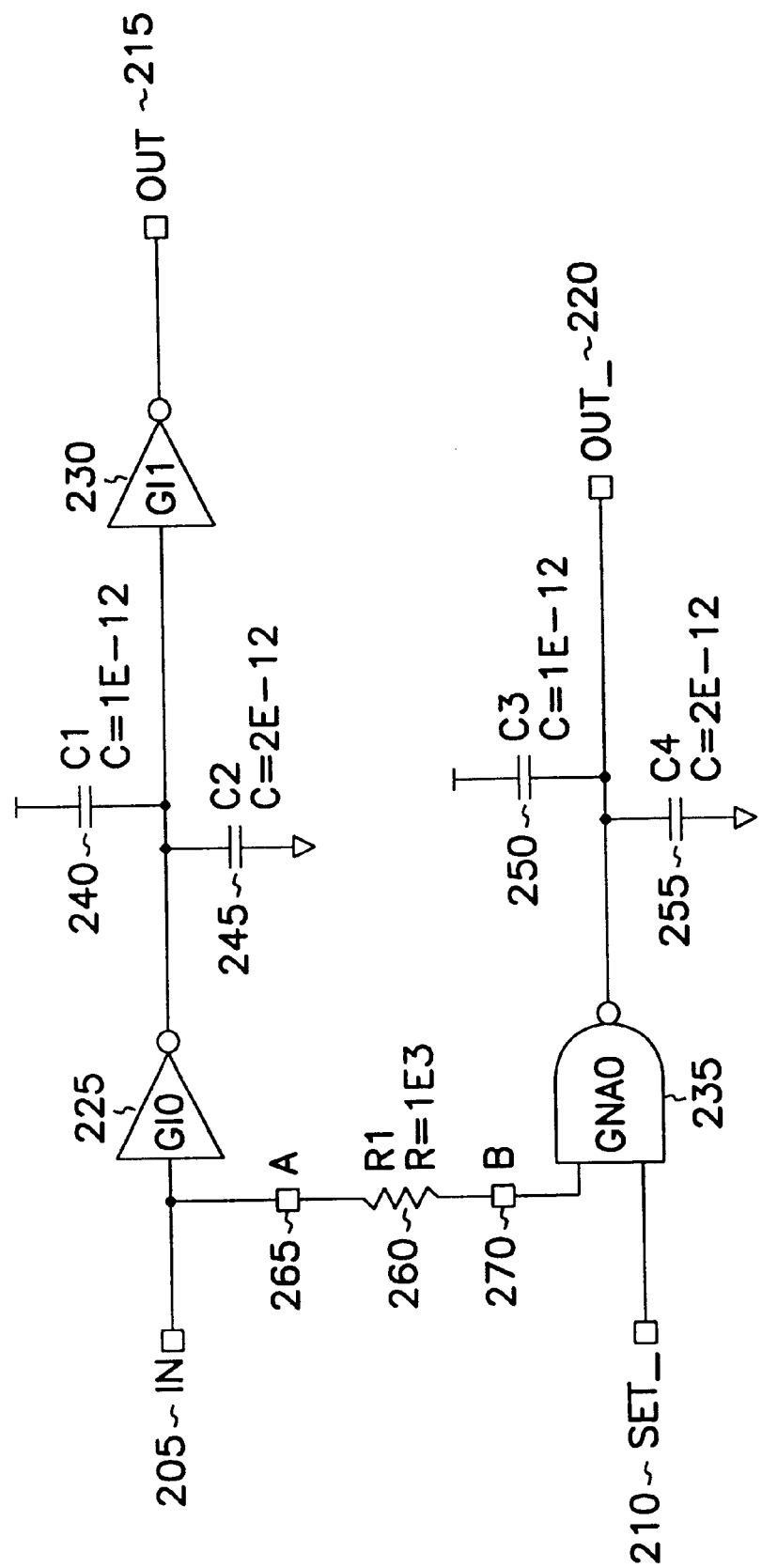
FIG. 2 is a schematic drawing of the subcircuit TMid.

Now referring to FIG. 2, TMid, which appears as two instances TMid 115 and TMid 120 in FIG. 1, is shown in detail. As indicated in FIG. 1, TMid has two input nets: net IN 205 and net SET_210. TMid also has two output nets: net OUT 215 and net OUT_220. TMid consists of two invertors, GI0 225 and GI1 230 as well as a NAND gate GNA0 235. Four capacitors C1 240, C2 245, C3 250, C4 255, and resistor R1 260, complete the subcircuit TMid. Resistor R1 260 is surrounded by terminal A 265 and terminal B 270. The capacitors 240 through 255 each have a property list, whose name is "c" and whose value is the capacitor's capacitance. Resistor R1 260 has a property list named "R" which lists the resistance value as "1e3."

To be useful to a simulator software package, schematic 105, must be translated into a textual netlist file. This translation is done by a computer program called a netlister. Netlisters are specific to the subsequent software tools which verify or simulate the circuit from the netlists. For example, one useful simulator is HSPICE, available from Meta-Soft, Inc., Campbell, Calif. The corresponding netlister which produces netlists compatible with HSPICE is the HNL Netlister tool, available from Cadence Design Systems, Inc., San Jose, Calif. Therefore, in such a system, the schematic 105 is converted by the Netlister tool into a hierarchical netlist. Then, HSPICE accepts the netlist as input for simulation. Of course, other simulation and verification tools and other corresponding netlisters implementing the present invention can also be used.

During the netlisting process, the present invention's automated simulation circuit loader can be implemented to modify the netlist so that during simulation, the netlist causes the simulator to simulate only a portion of the design while retaining the load of the entire design. There are several ways to accomplish this. The Netlister tool from Cadence allows the easy integration of client-written subroutines to perform specific functionality. Therefore, in one embodiment, the present invention is implemented within these interfaced subroutines to the Netlister tool.

Before describing how the present invention is implemented, first various netlists resulting from the schematic of FIG. 1 will be discussed. Then FIGS. 6 through 14 will illustrate how the present invention and the rest of the hierarchical netlister, loads the simulated circuit by automatically creating and writing a circuit of the appropriate load to the netlist.

FIG. 3 is a hierarchical netlist corresponding to schematic 105. In FIG. 3, the four types of instances are defined. The NAND instance 235 shown in FIG. 2 is defined in lines 3 through 10 of the netlist and is named 2nand. The invertor, placed as instances 110, 225 and 230, is defined in lines 12 through 17 and is named inv. The TMid instance 115 and 120 is defined by lines 19 through 34. (Note: Lines which begin with a "+", such as line 23, are continuations from the previous line.) The top level cell, TTop 105, is defined by lines 36 through 41.

The present invention can decrease the number of elements needed to be resolved by the simulator. For example, in FIG. 3, the 2nand subcircuit contains 4 elements and the inv subcircuit contains 2. These elementary instances are used in the TMid cell, which contains 13 elements. The entire schematic 105, uses a total of 28 elements (i.e., 2 sets of TMid elements and the two-element inv).

FIG. 4 shows a hierarchical netlist resulting from using a currently-used alternative method of partial circuit simulation. In FIG. 4, Cadence command n1Action is used. This command instructs the netlister to ignore the instance during simulation. FIG. 4 shows a netlist resulting from placing a n1Action property list on instance 120 of FIG. 1. Notice that the xi2 definition (line 41 of FIG. 3) is no longer included as part of the netlist—it has been ignored. However, such a netlist, using currently available procedures for simulating only a portion of a circuit has misleading results. Because invertor GI0 110 is now only driving a single instance of TMID (115) instead of two instances (115 and 120), the signal output from GI0 110 rises and falls at a faster rate.

Some engineers compensate for this misleading result by manually estimating the load differential. Other engineers compensate by inserting a capacitor of approximately the correct size so that the load is more accurate. Neither of these techniques are satisfactory. For example, placing the capacitor into the design is cumbersome as its size must be reestimated and changed whenever the TMid (115 or 120) or TTop 105 schematics are modified.

FIG. 5 shows a netlist resulting from the use of the present invention. Here, the automated simulation circuit loader has utilized the hspLoad directive in the schematic of instance TMid 120 to create a better netlist. Although instance TMid 120 only shows a single property list—the hspLoad, that instance actually contains two property lists. The engineer/user physically enters the hspLoad property list. Once entered, the user is prompted by the computer system for which input pins of the instance should be loaded. In the example shown in FIG. 1, the user could choose to select the IN pin, the SET_pin, or both the IN and SET_pins. The user's choice of input pins to load is tracked by an automatically created secondary property list. In some embodiments, this choice of load pins is indicated in a comment line in the netlist(see line 39).

In FIG. 5, notice the changes made to the netlist by the existence of hspLoad: the xi2 declaration is changed, the comment line 39 is added, and a new subcircuit, named tmid__1d1 has been generated. Lines 43 through 52 of FIG. 5 consist of the new tmid__1d1 subcircuit. This is the load subcircuit which is automatically created by the present invention during netlisting. It includes a flattened representation of their hierarchical circuit, which contains all the transistors and other primitive elements within TMid 120 that affect the load upon the rest of the circuit. Line 45 describes resistor R1 260. Lines 46 and 47 are the N- and P-type transistors from GI0 225. Lines 48 through 51 describe NAND gate 235. Line 40 is the xi2 declaration which now includes the tmid__1d1 load subcircuit. Thus, the present invention has generated a subcircuit which will accurately track the load of the non-simulated portions of the circuit and has named this subcircuit tmid__1d1.

Steps to Loading a Simulation Circuit

Figure 6:
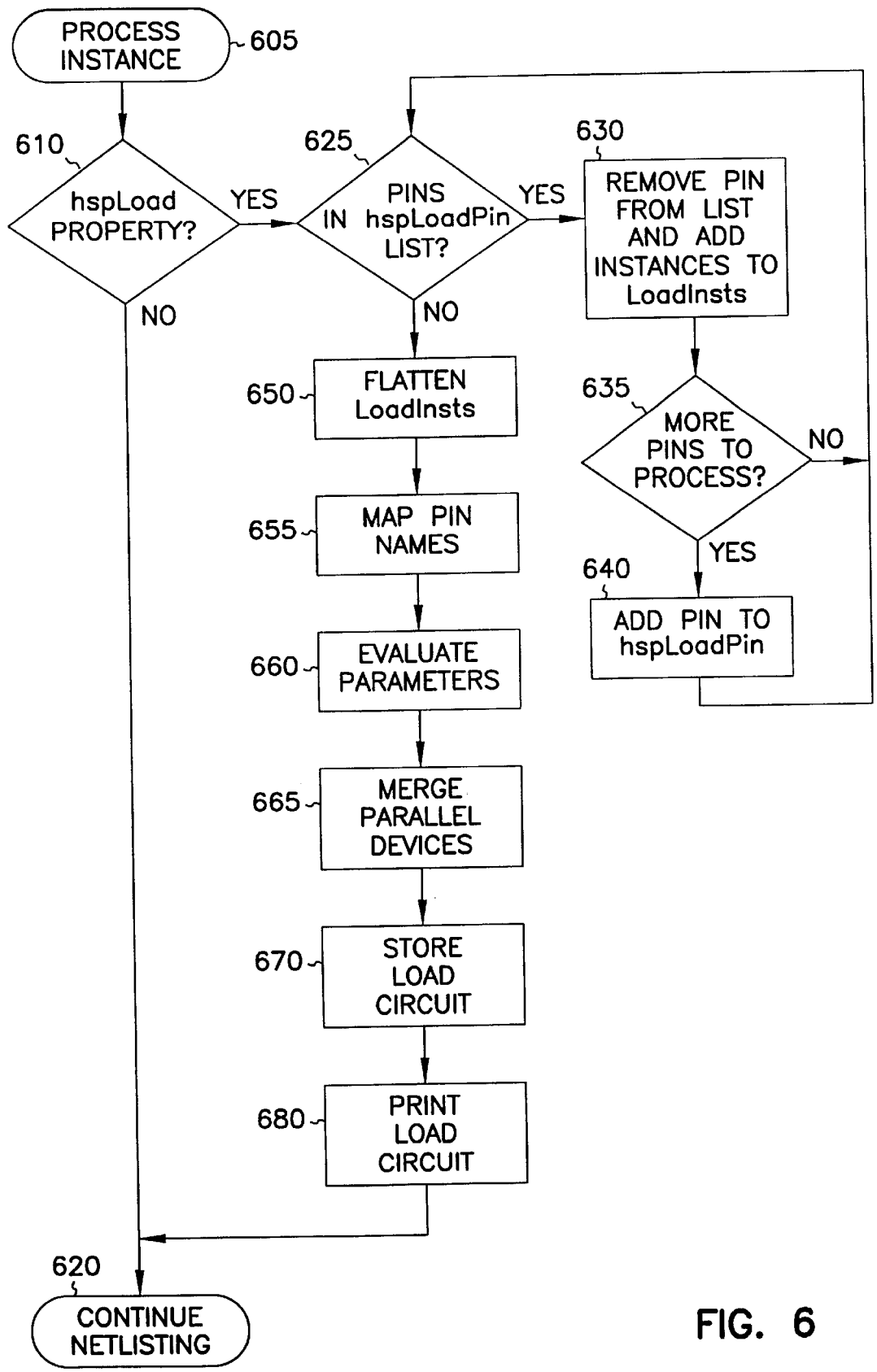
FIG. 6 is a flow chart of the steps taken by the present invention in creating a load circuit.

FIG. 6 is a flow chart of the general steps taken by the present invention in loading the simulation circuit. The detailed implementation of each of the general steps of FIG. 6 will be described in FIGS. 7 through 14, which follow. FIGS. 7 through 14 show how the present invention has been integrated with "hn1", the hierarchical netlister available from Cadence Design Systems. The portions of the FIGS. 7 through 14 which implement the present invention, as set forth in FIG. 6, will be cross-referenced with FIG. 6. Although the present invention is explained here in conjunction with hn1, the present invention could as readily be integrated with other netlisters.

In general terms, the process for creating a load circuit can consist of checking the instances in a circuit for the hspLoad or other directive. Then all of the primitive elements connected to the specified nets of the instances having the directive are collected. Collecting these primitive elements consists of first flattening the hierarchy of the circuit and then following each of the nets' routes through the circuit. When a primitive element is reached along the routes, it is collected and then the routes continue to be followed through the primitive elements and along another net "exiting" from a terminal of the primitive elements. The resulting load circuit is added to the netlist. In FIG. 6, the process for creating a load circuit starts at step 605, each instance handled by the netlister is processed one at a time. In general, for any instance having the hspLoad property list, the present invention will traverse the subcircuits. At the start of the loading process for an instance, the property lists on the instance are checked to determine if the hspLoad property list is present (see step 610). The presence of hspLoad indicates that the instance is to be replaced in the netlist with its equivalent load.

Step 625 determines whether there are pins to be processed. Remember that the user is prompted for the pins to load after the user enters the hspLoad property list. Assume that in circuit 105, the user indicated that both the IN and the SET__pins should be loaded. If there are pins in the list, then the first pin is removed from the list and the instance is added to the Loadinsts list at step 630. In our working example, pin IN would be removed from the list at 630 and the connected instances (invertor GI0 225 and resistor R1 260) would be added to the LoadInsts list. Then, if there are more pins to process (step 635), the pin is added to the hspLoadPin list at step 640. In our working example, at steps 635 and 640, the newly discovered pin found after passing through instance R1 260, which is pin B, is added at this time to the end of the hspLoadPin list. The list now contains the two elements of SET__and B. Control then returns to step 625 to determine if more pins need processing from the hspLoadPin list. The next two repetitions of steps 625 through 640 process pins SET__and B, resulting in the addition of the instance GNA0 235 to the LoadInsts list.

Once all of the pins have been processed by hspLoadPin, at step 650, the LoadInsts listing is flattened. At this step, all of the primitive elements from the instances in the LoadInsts list are gathered, including the transistors from GI0 225, GNA0 235 and the resistor of R1 260. The pins names are then mapped at step 655, causing the IN, SET__and B pins to be mapped to their proper names.

At step 660, the parameters of the instance are evaluated to return their proper values and then mapped in a similar fashion as the pin names were. At this step, parameters such as InA and wnA are converted to values such as 1.0 and 10.0.

Step 665 is an important feature of the automated simulation circuit loader. At step 665 parallel devices in the circuit are merged. Merging of parallel devices happens when, for example, two transistors having the same inputs and outputs are merged into one transistor with a multiplication factor. Merging the devices and creating a single merged device results in the existence of one less device for the simulator to resolve.

Finally, at step 670, the loaded circuit is stored and then automatically added, at step 680, to the netlist. The load circuit can be stored in a computer file and it can also be stored on the circuit at each hierarchical level for use by other subcircuits needing the information during simulation.

Incorporating HNL with Automated Circuit Loading

Figure 7:
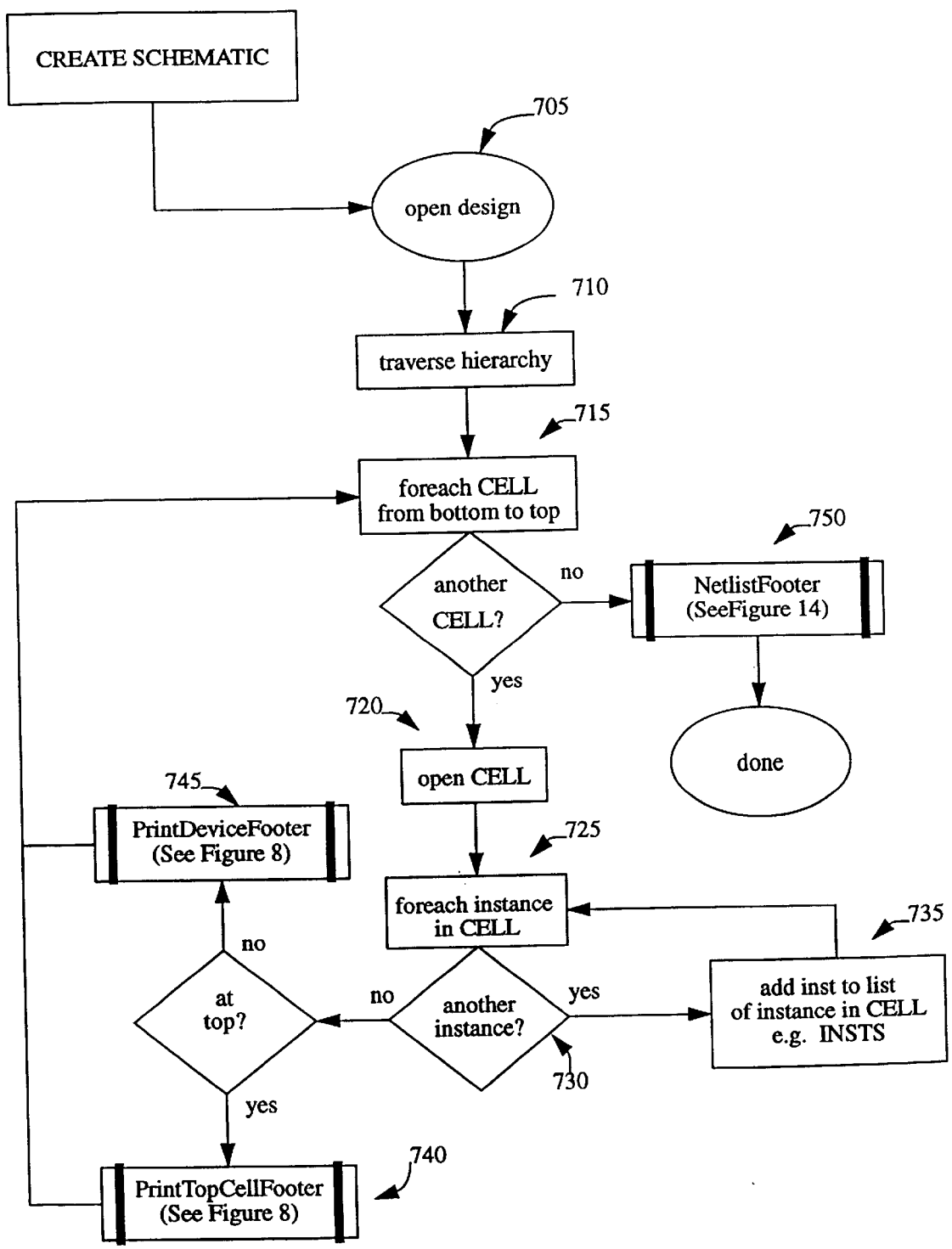
FIG. 7 is a flow chart of the general steps of a hierarchical netlister.

The elements of FIG. 6 are incorporated into various portions of the hierarchical netlister. FIGS. 7 through 14 show how the elements of FIG. 6 are integrated with the hn1 hierarchical netlister. FIG. 7 is a flow chart of the general steps of the hn1 hierarchical netlister. Once the schematic has been created, at step 705, schematic 105 of the design is opened. At step 710, the hierarchical netlister engine traverses the hierarchy of the design. At steps 715 and 720, each circuit of schematic 105 is delivered from the bottom level to the topmost level of the hierarchy and is opened. Steps 725 and 730 loop through each instance in the circuit and a listing, called INSTS, of the instances is created at step 735. After step 730, if the level being processed is the topmost level, the instances are printed to the circuit at step 740 by the routine named PrintTopCellFooter. (This routine is expanded upon by FIG. 8.) Otherwise, if the topmost level of the design is not being processed, the instances are printed to the subcircuit at step 745 by the routine named PrintDeviceFooter, which is expanded upon by FIG. 8 as well. Once all cells in a circuit design have been formatted, postprocessing is done by the routine NetlistFooter at step 750, which is expanded upon in FIG. 14.

Figure 8:
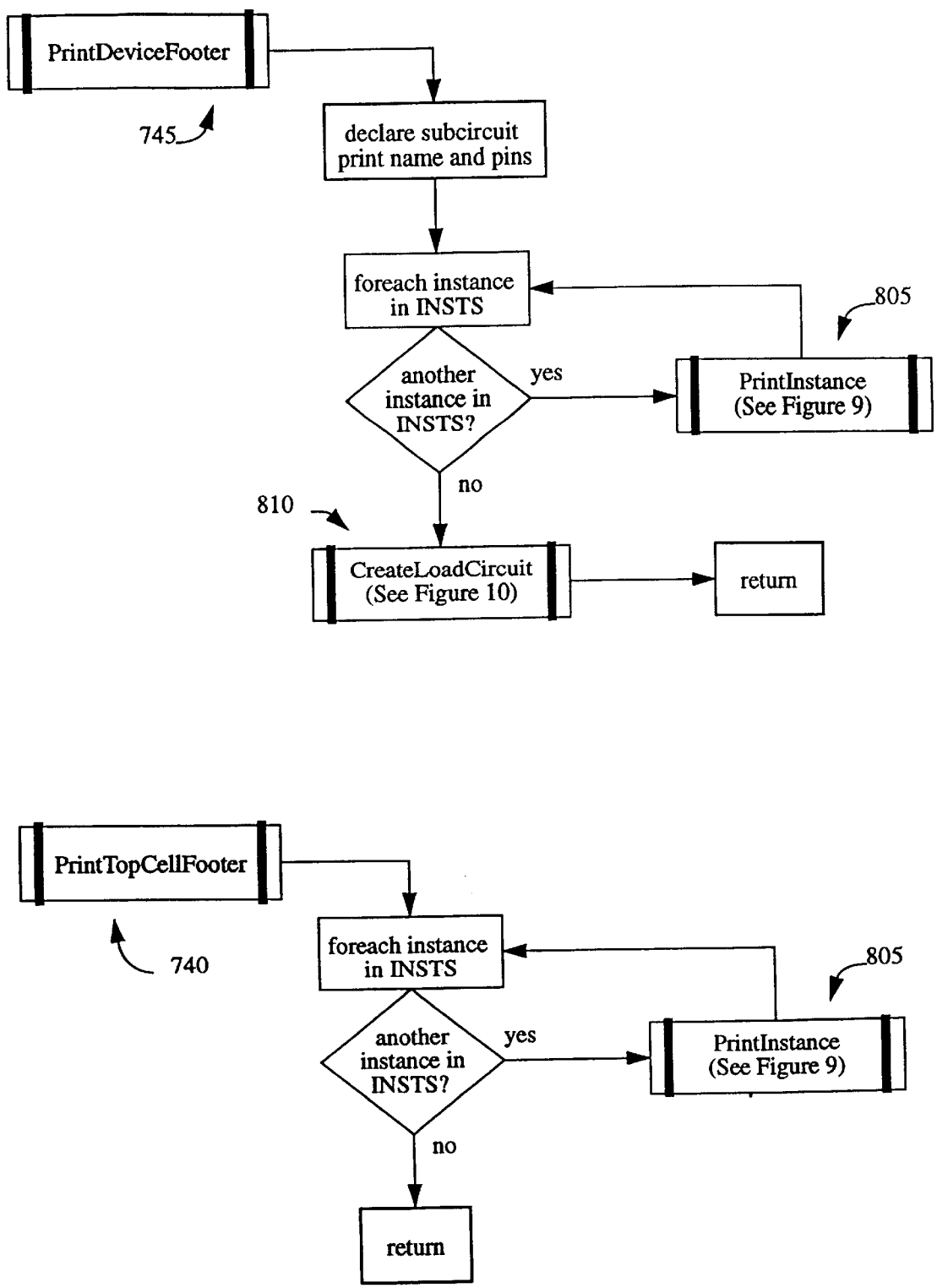
FIG. 8 is two flow charts of the PrintDeviceFooter and PrintTopCellFooter subroutines called by the flow chart of FIG. 7.

FIG. 8 describes the functions PrintDeviceFooter and PrintTopCellFooter, which are steps 745 and 740 respectively from FIG. 7. Each time that PrintDeviceFooter is called, each instance is printed to the netlister at step 805 by calling the routine PrintInstance (detailed in FIG. 9). Then the system creates a load circuit after the processing for the instances is finished. This is accomplished by calling the CreateLoadCircuit subroutine at step 810, which is detailed in FIG. 10. Similarly, when the netlister is at the top of the schematic and calls PrintTopCellFooter at step 740, each of the instances held in the INSTS list are printed at step 805 by calling PrintInstance (again, this is detailed in FIG. 9).

Figure 9:
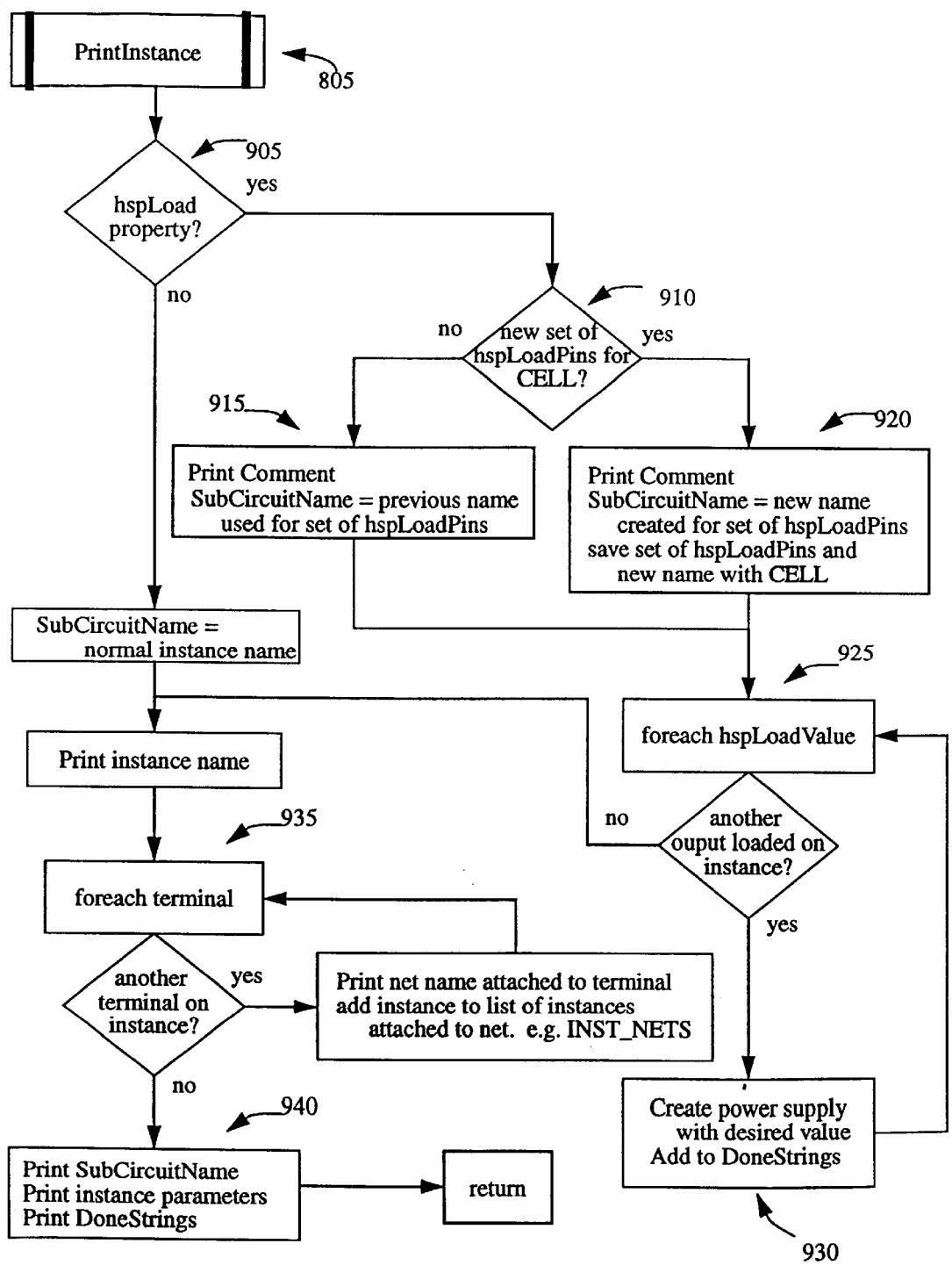
FIG. 9 is a flow chart of the PrintInstance subroutine called by the flow charts of FIG. 8.

The routine PrintInstance is diagramed in FIG. 9. This routine checks for the hspLoad property at step 905. If the hspLoad property is present, then its load must be tracked. To do this, at step 910, the netlister determines whether the load for this instance has been calculated previously. If it has, then a comment is written to the netlist at step 915. Otherwise, a comment is written and a name for this new load circuit is generated (step 920).

At step 925, the netlister loops through the output from the instance that drives other pins and assembles the DONESTRINGS listing. The output nets that drive other pins need to be driven to a known state. Otherwise, the simulator wouldn't be able to correctly simulate the circuit. So, a property list or other directive is used to track the desired voltage state of these output terminals. At step 930, a voltage value is forced by creating a new power supply device with the user's desired voltage value, as indicated by the property list.

The last loop of FIG. 9, which starts at step 935, prints the net name for each terminal in the instance and adds the name of the instance to the INST_NETS list. This list tracks all instances that are attached to any net. After the terminals are processed, at step 940, the subcircuit name is printed to the netlist as well as the parameters and the rest of the description of the instance. Then the new power supplies, which were created at step 930, are printed to the netlist.

Figure 10:
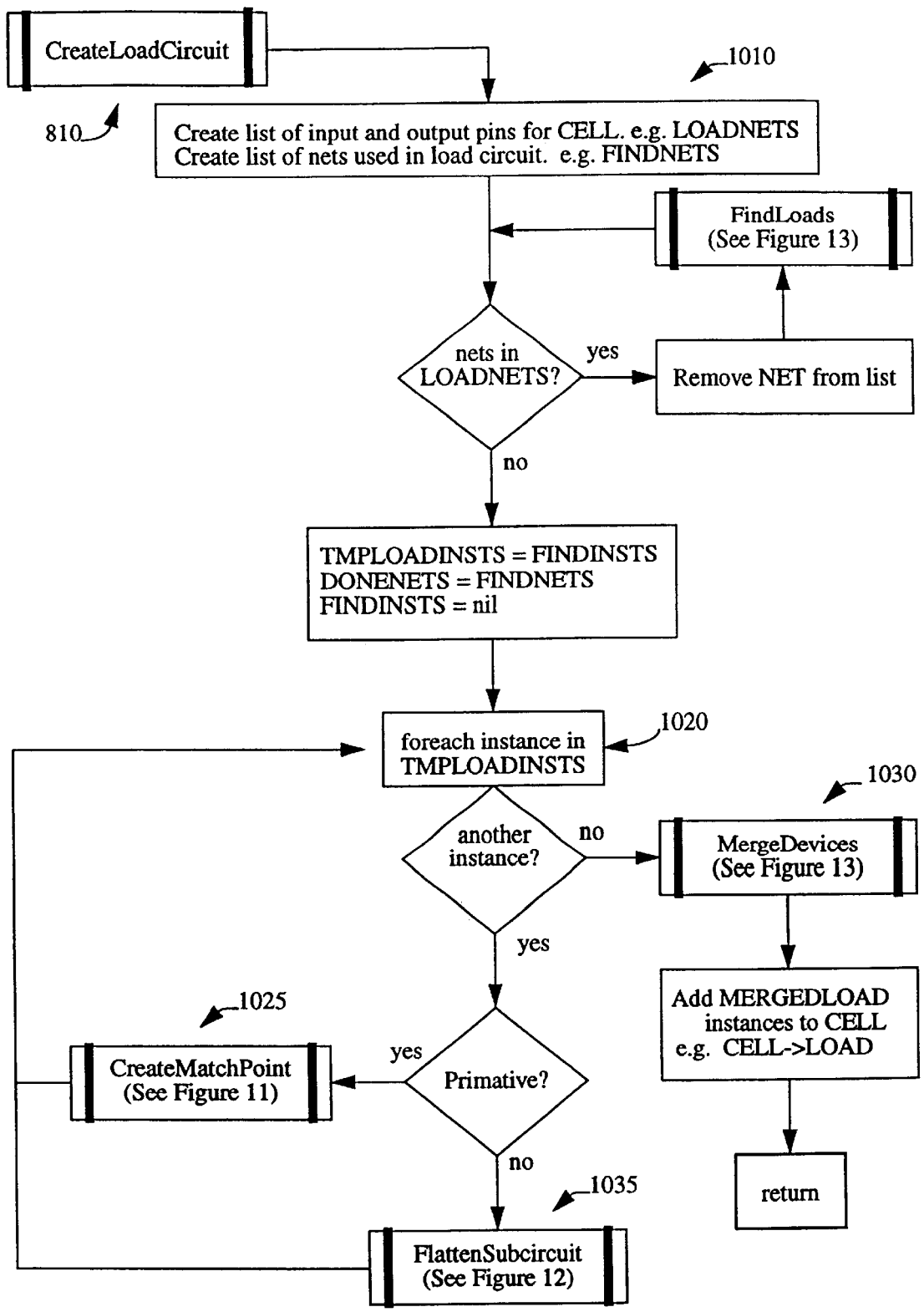
FIG. 10 is a flow chart of the CreateLoadCircuit subroutine called by the flow chart of FIG. 8.

FIG. 10 is a flow chart showing the function CreateLoadCircuit, which is step 810 from FIG. 8. This function, starting at step 1010, gets the list of pins/nets connected to the instance and starts walking through the circuit, finding which instances are connected to the pins and keeping a list of these instances. The lower loop of the function, starting at step 1020, starts the bookkeeping process of gathering information to be used later. At step 1025, the function CreateMatchPoint is called (see FIG. 11) which gathers the information needed to merge similar devices. Step 1035 flattens the hierarchical subcircuits (see FIG. 12), and at step 1030, the function MergeDevices does the merging of these devices (see FIG. 13).

Figure 11:
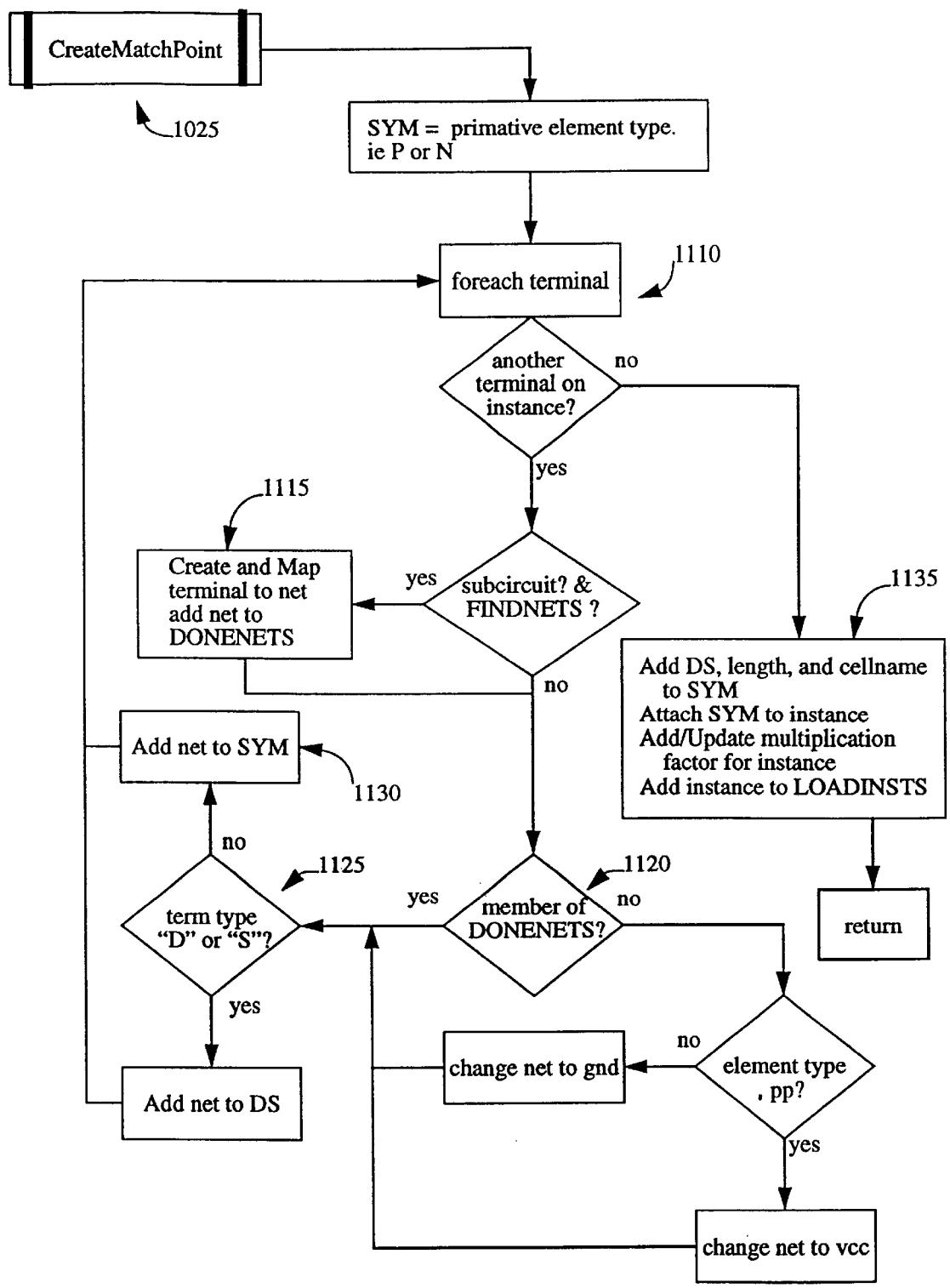
FIG. 11 is a flow chart of the CreateMatchPoint subroutine called by the flow chart of FIG. 10.

FIG. 11 is the flowchart of the CreateMatchPoint function from step 1025. This function gathers the data needed to merge similar devices into a single device. Merged devices enhance the speed of the simulation and are thus desirable. Previous systems have forced the user to determine which devices to merge and have then made the user enter the merge information manually. Using the function outlined in FIG. 11, merging of devices is automatically accomplished. In general, parallel devices are automatically merged by the present invention by checking that all of the corresponding pins from each of the two devices are connected to the identical nets. Then, the device class of each of the two devices must be checked as only devices from the same device class (i.e., having the same drive characteristics) can be merged. Once it is determined that two devices can indeed be merged, a new merged device is created having a merged width value and a merged multiplication value representative of the width and multiplication values from the two devices. This merge method can be used repeatedly, thus causing any number of parallel devices to be merged down into a single device.

Again, referring to FIG. 11, at step 1110, the function begins walking through each terminal on the primitive device. If the terminal is from a subcircuit, additional mapping is needed (accomplished at step 1115) to track the hierarchical complexity. The variable FINDNETS is a list of nets already found in the circuit. DONENETS is a variable listing all nets used in the load circuit. At step 1120, if the terminal has not already been used in the load circuit, i.e., DONENETS is FALSE, then the terminals of the p-type transistors are tied to vcc! and the n-type transistors are tied to gnd!.

If the net is a source or drain region, at step 1125, then the net is added to the DS list. Other regions, such as gates on a transistors, resistors, or capacitors, have their net added to the SYM listing at step 1130. Finally, at step 1135, the information for the region is added to the instance by the SYM list being assigned the DS, length and cellname of the instance. The multiplication factor (property value of "m") for the instance is determined stored with the instance. The name of the instance is added to the list LOADINSTS.

Figure 12:
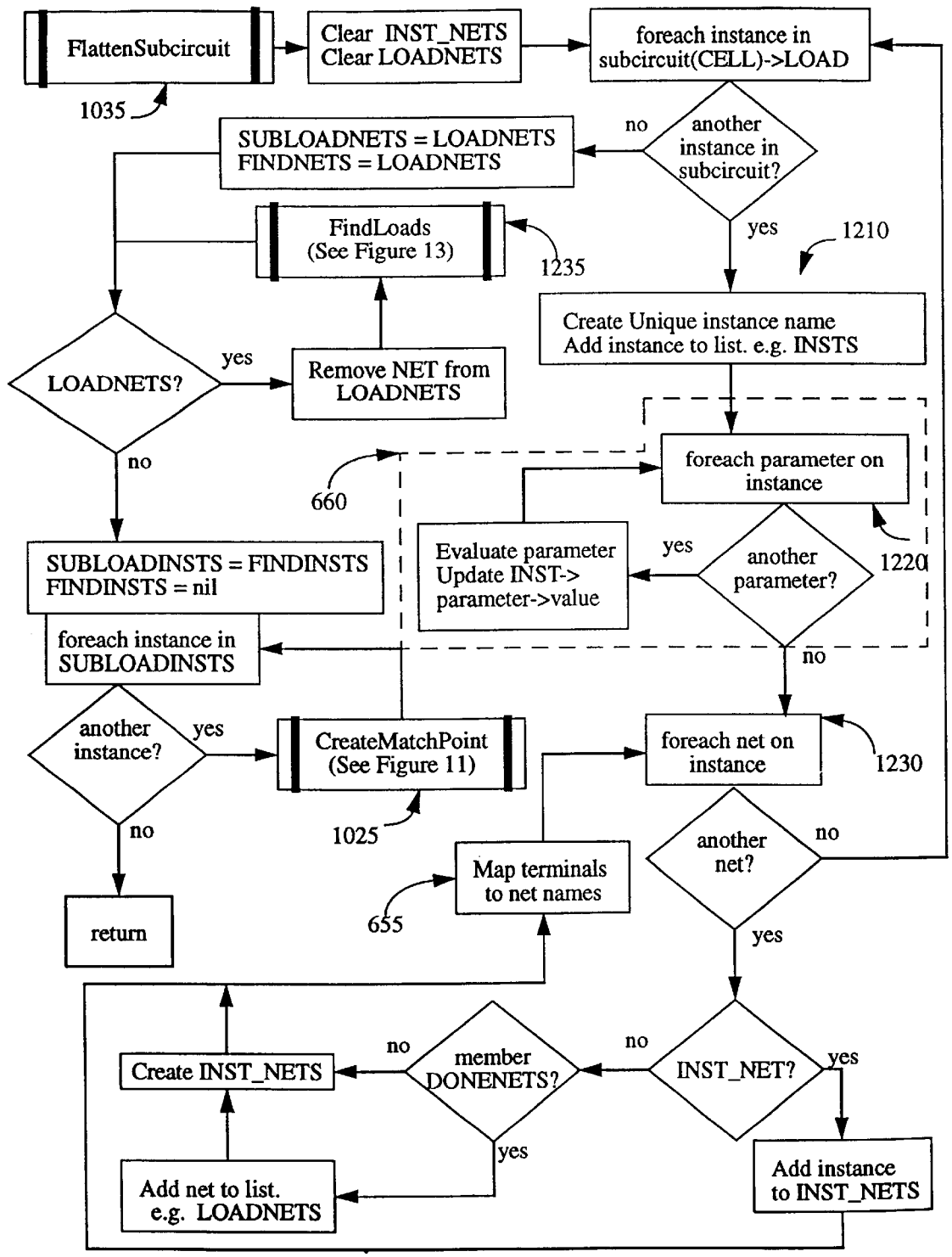
FIG. 12 is a flow chart of the FlattenSubcircuit subroutine called by the flow chart of FIG. 10.

FIG. 12 is a flowchart of the function FlattenSubcircuit, which is referenced at step 1035. This routine brings up the properties of lower hierarchical cells. The name of each instance in the lower subcircuit is added to the instance list INSTS at step 1210. Then, all of the parameters within the instance are evaluated, at step 1220 and beginning at step 1230, the terminals within the instance are mapped to their upper level names by maintaining the variables LOADNETS and INST_NETS. For example, the SET_terminal in the first instance of TMid is mapped to S1 and the SET_terminal in the second instance of TMid is mapped to S2.

Figure 13:
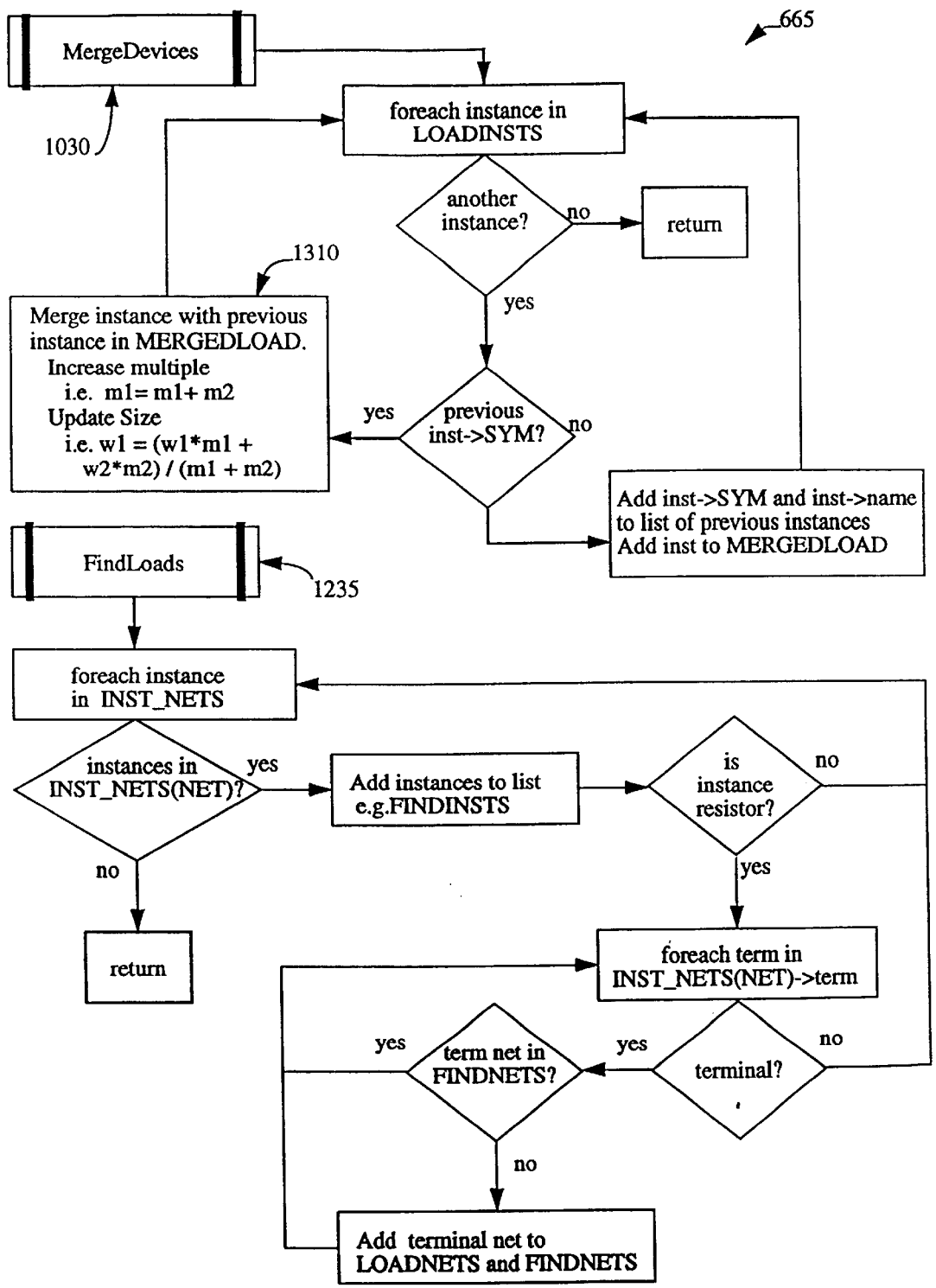
FIG. 13 is a flow chart of the MergeDevices subroutine called by the flow chart of FIG. 10 and the FindLoads subroutine called by the flow chart of FIG. 12.

The function call MergeDevices, at step 1030, which is detailed in FIG. 13, accomplishes the actual automatic merging of similar devices in the circuit. Referring now to FIG. 13, for each instance in the circuit, at step 1310, two devices are merged by updating the multiplication value and the size.

FIG. 13 is also the flowchart of the FindLoads routine from step 1235. The FindLoads returns the FINDINSTS variable, which is a list of instances that are still eligible to be in the load circuitry. This routine provides coding to walk through passive devices (such as resistors, capacitors, and inductors) and grab the terminal/net from the other side of the passive device and continue traversing the circuitry since the load doesn't terminate at a resistor.

Figure 14:
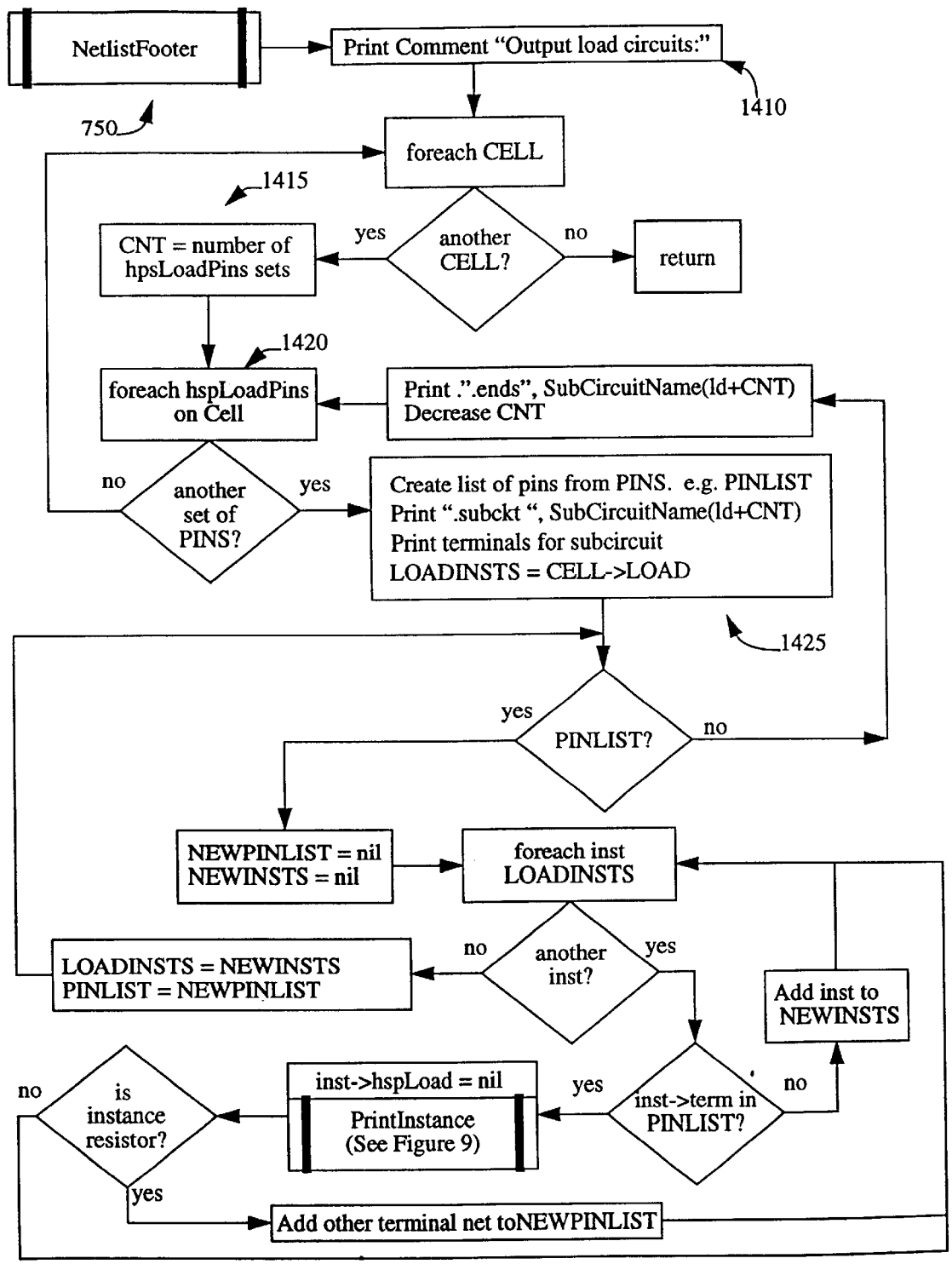
FIG. 14 is a flow chart of the NetlistFooter subroutine called by the flow chart of FIG. 7.

FIG. 14, is the flowchart for the NetlistFooter subroutine from step 750. This is the postprocessing routine which prints each of the load circuits to the already constructed netlist. Up until this point, all the necessary data has been gathered, and now it is time to create the load circuits previously referenced in the subcircuits. At this point, each cell has a list of nodes and a listing of how the cell is loaded. Looping through each cell of the circuit, each of the ways of loading the cell is extracted at step 1415. Each way of loading the cell is defined by a list of pins. The loop starting at step 1420 defines one subcircuit load. In this loop, the list of pins is taken and the netlister finds all of the instances connected to the nets which are connected to the pins and prints them out in the new load subcircuit.

Other embodiments of the present invention are possible without departing from the scope and spirit of the present invention. Other embodiments of this invention include a configurations for other commercial simulators, such as Verilog or HDL.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

We claim:

1. A method in a netlister of a computer system to merge two devices in a circuit, comprising operating the computer system to perform the steps of:

identifying a corresponding plurality of pins associated with the two devices;

determining that the corresponding plurality of pins from each of the two devices are connected to identical nets in the circuit;

verifying that the two devices are members of the same device class;

calculating a merged width value from the widths of the two devices;

calculating a merged multiplication value from the multiplication values of the two devices; and creating a merged device in the circuit, wherein the merged device is representative of the two devices; and storing the merged device in the circuit.

2. The method to merge two devices in a circuit, as recited in claim 1, further comprising operating the computer system to perform the step of determining whether the two devices are of equal length.

3. A device merger, comprising:

a pin identifier for identifying a corresponding plurality of pins associated with two devices in a circuit;

a parallel determiner for determining that the corresponding plurality of pins from each of the two devices are connected to identical nets in the circuit;

a class verifier for verifying that the two devices are members of the same device class;

a width calculator for calculating a merged width value from the widths of the two devices;

a multiplication calculator for calculating a merged multiplication value from the multiplication values of the two devices; and device creator for creating a merged device in the circuit, wherein the merged device is representative of the two devices; and a device storage module for storing the merged device in the circuit.

4. The device merger, as recited in claim 3, further comprising a length identifier for determining whether the two devices are of equal length.

5. A device merger, comprising a computer readable medium having computer readable program code embodied thereon, the computer readable program code, when executed, implementing on a computer a method for merging two devices in a circuit, the method comprising the steps of:

identifying a corresponding plurality of pins associated with the two devices;

determining that the corresponding plurality of pins from each of the two devices are connected to identical nets in the circuit;

verifying that the two devices are members of the same device class;

calculating a merged width value from the widths of the two devices;

calculating a merged multiplication value from the multiplication values of the two devices; and creating a merged device in the circuit, wherein the merged device is representative of the two devices; and storing the merged device in the circuit.

6. The device merger, as recited in claim 5, the mether further comprising the step of determining whether the two devices are of equal length.

* * * * *